United States Patent [19]

Clark, II

[11] Patent Number: 4,804,865
[45] Date of Patent: Feb. 14, 1989

[54] FAST VOLTAGE REFERENCE STABILIZATION CIRCUIT

[75] Inventor: Jack E. Clark, II, Palm Bay, Fla.

[73] Assignee: Harris Corporation, Melbourne, Fla.

[21] Appl. No.: 27,940

[22] Filed: Mar. 19, 1987

[51] Int. Cl.$^4$ .................... H03K 3/01; G05F 3/16
[52] U.S. Cl. .................... 307/297; 365/189; 307/540; 307/544
[58] Field of Search ............ 307/473, 544, 549, 550, 307/297, 540, 530; 323/314, 313; 365/227, 229, 189

[56] References Cited

U.S. PATENT DOCUMENTS

| | | | |
|---|---|---|---|
| 3,949,242 | 4/1976 | Hirasawa et al. | 307/473 |
| 4,217,502 | 8/1980 | Suzuki et al. | 307/473 |
| 4,324,991 | 4/1982 | Tamaki | 307/473 |
| 4,460,985 | 7/1984 | Hoffman | 307/530 |
| 4,585,958 | 4/1986 | Chung et al. | 307/473 |
| 4,754,167 | 6/1988 | Conkle et al. | 365/104 |

Primary Examiner—Stanley D. Miller
Assistant Examiner—B. P. Davis
Attorney, Agent, or Firm—Barnes & Thornburg

[57] ABSTRACT

A circuit for providing a fast stabilization of the reference voltage level produced by a reference generation circuit includes a clamping circuit which clamps the refernece node at a voltage approximately equal to the voltage produced by the reference generation circuit when the reference voltage level is disabled. When the reference generation circuit is enabled, the reference node has to be pulled only slightly to reach the proper reference voltage, thereby increasing the speed of the device and the clamping circuit is turned off.

13 Claims, 1 Drawing Sheet

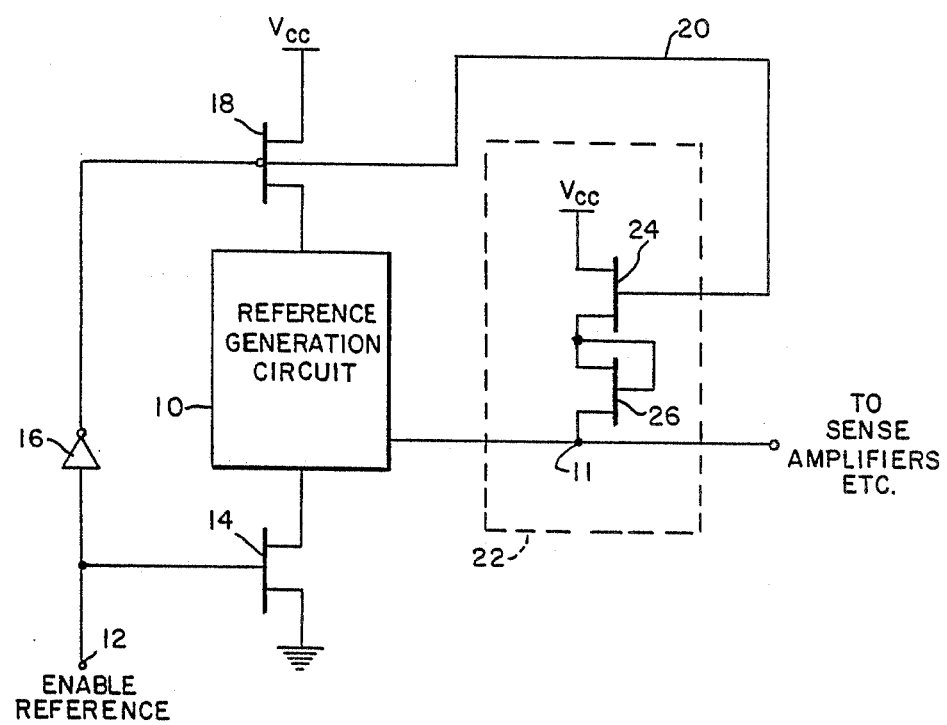

FAST VOLTAGE REFERENCE STABILIZATION CIRCUIT

BACKGROUND AND SUMMARY OF THE INVENTION

The present invention relates to a voltage reference stabilization circuit for supplying a reference voltage at a reference node and, more particularly, to a circuit for stabilizing this reference voltage.

Voltage references are used in analog type MOS circuitry to bias the circuits at a given operating point. Voltage references are commonly used with sense amplifiers and high impedance loads. Typically, voltage reference generation is accomplished through a voltage divider network. The reference voltage is then taken off a node of the voltage divider.

In CMOS circuits that have voltage referenced analog circuitry, the dc current path of the reference must be shut off when the part is in standby mode. Disabling the current path through the voltage divider allows the reference node to pull to VCC or VSS, or will tri-state the reference node.

However, a problem arises with this gating technique. When the reference is first enabled, the reference node must be pulled from VCC or VSS (or somewhere in between) to the normal reference voltage. The amount of time required for the reference node to be pulled to its normal reference level and stabilized at this level can be considerable, especially if the reference node is heavily loaded. Since in CMOS memory applications, the circuitry which uses the reference voltage partially determines the overall speed of the device, it is important to establish and stabilize a reference voltage as quickly as possible. In any event, the reference voltage must be established and stabilized before the circuitry using the reference voltage can be utilized. Thus, reducing the stabilization time will increase the overall speed of the device.

Therefore, an object of the invention is to provide a circuit which will stabilize the reference node near its normal operating point when the reference is disabled.

Another object of the invention is to provide a voltage reference stabilization circuit which improves the overall speed of the memory device by reducing the time required for the reference node to be pulled to its normal reference level.

A further object of the invention is to provide a voltage reference stabilization circuit which ensures that the circuitry which uses the reference voltage will function properly, by establishing the proper reference voltage before the circuitry is utilized.

These and other objects are obtained in the present invention by providing a voltage reference stabilization circuit having a reference voltage generator for supplying a reference voltage at a reference node. The reference voltage generator is enabled and disabled by enable circuit, while a clamping circuit clamps the reference node at a clamp voltage approximately equal to the reference voltage whenever the reference voltage generator is disabled by the enable means.

An advantage of the voltage reference stabilization circuit provided by the present invention is the elimination of a large part of the delay in establishing a reference voltage. By substantially eliminating the delay, the proper functioning and the speed performance of the analog circuitry that uses the voltage reference is increased. This increases the overall speed of the memory device.

Other objects, advantages and novel features of the present invention will become apparent from the following detailed description of the invention when considered in conjunction with the accompanying drawings.

BRIEF DESCRIPTION OF THE DRAWINGS

The FIGURE is a partial schematic and block diagram of a preferred embodiment of the present invention.

DETAILED DESCRIPTION OF THE DRAWINGS

In the drawing figure, a reference generation circuit 10, shown as a block, is typically a voltage divider network through which current is passed. The reference voltage is produced by the reference generation circuit 10 at the reference node 11. The analog circuitry using this voltage at the reference node as a reference, which includes sense amplifiers, and other loads, are not shown.

In most CMOS circuits that contain voltage referenced analogs circuitry, the reference generation circuit must be turned off periodically. The enable circuit in the present invention includes an enable reference generator 12 (shown in block diagram form) which produces an enable signal that controls the turning on and off of the reference generation circuit 10. The enable reference generator 12 supplies the signal through inverter 16 to a transistor 18 which is connected between VCC and the reference generation circuit 10. The enable reference generator 12 is also connected to the gate of transistor 14 which is connected between the reference generation circuit 10 and ground. The transistor 18 is shown in FIG. 1 as a P-channel device, while transistor 14 is an N-channel device. Thus, a high signal generated by the enable reference generator will turn on both transistors 14 and 18 and the reference generation circuit 10 is enabled.

A low signal from the enable reference generator 12 produces a high at transistor 18 and a low at the gate of transistor 14, thereby turning both devices off and tri-stating the reference generation circuit 10 and the reference node 11. This prevents current flow from the reference node 11 through the reference generation circuit 10.

The inverted enable reference signal received at the gate of transistor 18 is also received by the transistor 24 of the voltage reference clamp indicated in dashed lines as reference numeral 22. Transistor 24 is shown in FIG. 1 as an N-channel device. Because transistor 24 is an N-channel device and transistor 18 is a P-channel device, when the same enable or disable signal is present at both gates, they will assume opposite on/off states with respect to one another. The drain of transistor 24 is connected to VCC while the source of transistor 24 is connected to both the drain and the gate of transistor 26 of the voltage reference clamp 22. The source of transistor 26 is connected to the reference node 11. Like transistor 24, the transistor 26 is an N-channel device.

By providing that transistor 18 is turned off when transistor 24 is turned on and vice versa, it is assured that the reference generation circuit 10 is turned on when the voltage reference clamp 22 is turned off, and vice versa.

The two N-channel transistors 24, 26 connected between VCC and the reference node act to supply a voltage that is approximately equal to the reference voltage supplied by the reference generation circuit 10 when it is enabled. Although two transistors 24, 26 are shown, it is contemplated to provide any number of transistors or at least one transistor and any number of voltage dropping loads in the voltage reference clamp 22 that would give a certain voltage drop from VCC to the reference nodal, which would approximate the reference voltage.

In operation, the reference generation circuit 10 is enabled by a high enable reference signal from the enable reference generator 12, while this same signal disables the voltage reference clamp 22. The reference generation circuit 10 produces a reference voltage at reference node 11. The circuitry not shown in FIG. 1 that uses this reference voltage can then be enabled.

The enable reference generator 12 then outputs a low enable signal which disables N-channel device 14 and the inverted low enable signal turns off the P-channel device 18, thereby tri-stating the reference generation circuit 10. The tri-stating of the reference generation circuit 10 when the voltage reference circuit is disabled prevents any current flow from the reference node through the reference generation circuit 10.

At the same time the reference generation circuit 10 is disabled, the voltage reference clamp 22 is enabled by the low enable reference signal which is inverted by inverter 16 and received at the gate of N-channel device 24. The devices 24 and 26 of the voltage reference clamp 22 are turned on and a voltage is produced at the reference node 11 which is the voltage VCC minus the $V_t$ drops introduced by the devices 24 and 26. This voltage (VCC-2$V_t$) is approximately equal to the reference voltage. Thus, the reference node 11 is clamped to a voltage close to the reference voltage when the reference generation circuit is disabled.

When once again the reference generation circuit 10 is enabled and the voltage reference clamp 22 is disabled, the voltage at the reference node 11 has to pulled only slightly, since it was at a voltage approximately equal to the reference voltage. As noted earlier, this increases the speed of stabilization of the reference node 11 at the proper reference voltage, and allows the voltage referenced analog circuitry to be turned on sooner, and thereby increases the overall speed of the device.

Although the preferred embodiment described shows a specific configuration of P and N-channel devices and supply voltages, this is not to be taken by way of limitation, as the specific polarities of the supply voltages and the P and N-channel devices can be changed accordingly without departing from the scope of the invention. Similarly, other types of switching devices are contemplated, instead of the channel devices described above.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A voltage reference stabilization circuit, comprising:
    reference voltage generation means for supplying a reference voltage at a reference node;
    enable means connected to said reference voltage generation means for enabling and disabling said reference voltage generation means; and
    clamping means connected to said reference node and said enable means for clamping said reference node at a clamp voltage approximately equal to said reference voltage when said reference voltage generation means is disabled by said enable means.

2. The circuit of claim 1, wherein said enable means enables and disables said clamping means when said reference voltage generation means is disabled and enabled respectively.

3. The circuit of claim 2, wherein said clamping means has at least one switch means connected between a voltage source and said reference node for connecting and disconnecting said voltage source and said reference node.

4. The circuit of claim 3, wherein said switch means is a transistor that is actuated by said enable means.

5. The circuit of claim 1, wherein said enable means includes enable signal generator means for generating enable and disable reference signals, and at least two switch means for disabling and tri-stating said reference voltage generation means in response to said disable reference signal.

6. The circuit of claim 5, wherein said tri-state switch means are transistors.

7. The circuit of claim 6, wherein a first said transistor is connected between a first voltage level and said reference voltage generation means, and a second transistor is connected between the reference voltage generation means and a second voltage level.

8. The circuit of claim 7, wherein the first transistor is turned on and off and the clamping means is turned off and on respectively in response to the same enable reference signal.

9. The circuit of claim 1, wherein the clamping means includes a plurality of transistors connected to series for providing a predetermined voltage drop between the supply voltage and said reference node.

10. A voltage reference stabilization circuit, comprising:
    reference voltage generator means having an output reference node for generating a reference voltage, and
    stabilizing means connected to said reference voltage generator means, ground and a voltage source for eliminating a current path to ground through said reference voltage generator means and providing a voltage at said reference node approximately equal to said reference voltage when said reference voltage generator means is turned off by eliminating a current path to ground through said reference voltage generator.

11. The circuit of claim 10, wherein said stabilizing means includes tri-stating means for tri-stating said reference voltage generator means such that no current path to ground exists when said reference voltage generator means is tri-stated.

12. The circuit of claim of 11, wherein said stabilizing means includes clamping means for providing a clamped voltage approximately equal to said reference voltage when said reference voltage generator means is tri-stated.

13. The circuit of claim 1, wherein said enable means includes two switch means connected between said reference voltage generation means and first and second voltage levels respectively, and enable signal generation means for generating enable and disable reference signals to activate and deactivate each of said switch means.

* * * * *